(12) United States Patent
Fukushima

(10) Patent No.: US 12,142,869 B2
(45) Date of Patent: Nov. 12, 2024

(54) ELECTRONIC COMPONENT AND ELECTRONIC APPARATUS

(71) Applicant: TOKYO COSMOS ELECTRIC CO., LTD., Zama (JP)

(72) Inventor: Hajime Fukushima, Kanagawa (JP)

(73) Assignee: TOKYO COSMOS ELECTRIC CO., LTD., Zama (JP)

( * ) Notice: Subject to any disclaimer, the term of this patent is extended or adjusted under 35 U.S.C. 154(b) by 239 days.

(21) Appl. No.: 17/763,434

(22) PCT Filed: Sep. 18, 2020

(86) PCT No.: PCT/JP2020/035481
§ 371 (c)(1),
(2) Date: Mar. 24, 2022

(87) PCT Pub. No.: WO2021/060188
PCT Pub. Date: Apr. 1, 2021

(65) Prior Publication Data
US 2022/0344853 A1    Oct. 27, 2022

(30) Foreign Application Priority Data

Sep. 27, 2019  (JP) .................... 2019-177100
Jan. 7, 2020  (JP) .................... 2020-000861

(51) Int. Cl.
*H01R 13/24* (2006.01)
*H01R 12/58* (2011.01)
*H01R 12/70* (2011.01)

(52) U.S. Cl.
CPC ....... *H01R 13/2421* (2013.01); *H01R 12/585* (2013.01); *H01R 12/7064* (2013.01)

(58) Field of Classification Search
CPC .. H01R 13/2421; H01R 12/714; H01R 13/24; H01R 2201/20; H01R 24/50; H01R 12/716
See application file for complete search history.

(56) References Cited

U.S. PATENT DOCUMENTS 5,388,998 A * 2/1995 Grange .................. H01R 12/52
347/50
5,452,948 A * 9/1995 Cooper ............... B60R 16/0239
137/884

(Continued)

FOREIGN PATENT DOCUMENTS

JP  S61172471 U   10/1986
JP  H01119170 U    8/1989

(Continued)

OTHER PUBLICATIONS

International Search Report for International Application No. PCT/JP2020/035481; Date of Mailing, Nov. 17, 2020.

*Primary Examiner* — Truc T Nguyen
(74) *Attorney, Agent, or Firm* — CANTOR COLBURN LLP

(57) ABSTRACT

This electronic component can reduce assembly costs and also lighten the load to a connection part, and comprises: an electronic component body; a terminal that extends in a prescribed direction from the electronic component body, and has a retaining unit; and a coil spring that is externally fitted to be in electrical contact with the terminal, and that is retained by the retaining unit, wherein the coil spring is in electrical contact with a printed board in a compressed state. The terminal is fitted loosely in a fitting hole of the printed board, for example. Also, the coil spring comprises an electrically conductive coating, for example.

3 Claims, 5 Drawing Sheets

(56) References Cited

U.S. PATENT DOCUMENTS

| | | | | |
|---|---|---|---|---|
| 7,090,374 B2* | 8/2006 | Arthur | ................... | H01H 1/242 |
| | | | | 362/205 |
| 7,677,901 B1* | 3/2010 | Suzuki | ............... | G01R 1/06722 |
| | | | | 439/66 |
| 7,864,024 B2* | 1/2011 | Schlenker | ............ | H05K 1/0201 |
| | | | | 337/407 |
| 7,878,834 B2* | 2/2011 | Sherman | ................ | H05K 3/325 |
| | | | | 439/324 |
| 2006/0172613 A1* | 8/2006 | Sasaki | ................ | H01R 13/2421 |
| | | | | 439/824 |
| 2023/0168753 A1* | 6/2023 | Hartman | ................ | G01D 5/142 |
| | | | | 345/184 |
| 2024/0013989 A1* | 1/2024 | Zhou | .................... | H01H 13/023 |

FOREIGN PATENT DOCUMENTS

| | | | |
|---|---|---|---|
| JP | 2000151064 A | 5/2000 | |
| JP | 2000243167 A | 9/2000 | |

* cited by examiner

ELECTRONIC COMPONENT AND ELECTRONIC APPARATUS

CROSS REFERENCE TO RELATED APPLICATIONS

This is the U.S. national stage of application No. PCT/JP2020/035481, filed on Sep. 18, 2020. Priority under 35 U.S.C. § 119(a) and 35 U.S.C. § 365(b) is claimed from Japanese Application No. 2019-177100, filed Sep. 27, 2019, and from Japanese Application No. 2020-000861, filed on Jan. 7, 2020, the disclosures of which are both also incorporated herein by reference.

TECHNICAL FIELD

The present invention relates to an electronic component and an electronic apparatus.

BACKGROUND ART

It is known in the related art that soldering is performed to connect a terminal of an electronic component and a printed board.

In a case where soldering is performed by a soldering robot, facility costs increase. Further, in a case where soldering is performed by a worker, it takes man-hours of soldering work. Given the above, there is a problem that assembly costs increase.

Further, Patent Literature (hereinafter referred to as "PTL") 1 discloses an electronic apparatus, which includes two contact members disposed to face each other and a coil spring disposed between the two contact members, and in which both end parts of the coil spring are welded to the two contact members with an electrically conductive adhesive.

CITATION LIST

Patent Literature

PTL 1

Japanese Patent Application Laid-Open No. 2000-243167

SUMMARY OF INVENTION

Technical Problem

Incidentally, in a case where the end part of the coil spring is welded to the contact member with the electrically conductive adhesive in the electronic apparatus described in PTL 1, the welding is performed while the coil spring is held at a predetermined position by a jig, for example, so that it takes man-hours in the same manner as in soldering work, which poses a problem that assembly costs increase.

Further, for example, there is a problem that in a case where an impact or the like is applied to an electronic component, a load is applied to a soldered connection part or to a connection part welded by an electrically conductive adhesive.

An object of the present invention is to provide an electronic component and an electronic apparatus each capable of reducing assembly costs and lightening a load to a connection part.

Solution to Problem

To achieve the above object, an electronic component in the present invention includes:

an electronic component body;
a terminal that extends in a prescribed direction from the electronic component body and includes a retaining part; and
a coil spring that is externally fitted around the terminal so as to be in electrical contact with the terminal and is retained by the retaining part, in which
the coil spring is, in a compressed state, in electrical contact with a printed board.

An electronic apparatus in the present invention includes:
the electronic component; and
a case that houses the electronic component, in which
the printed board includes a fitting hole having a depth direction in the prescribed direction, and is attached to the case such that the terminal is fitted in the fitting hole.

Advantageous Effects of Invention

The electronic component of the present invention is capable of reducing assembly costs and lightening a load to a connection part.

DESCRIPTION OF EMBODIMENTS

Figure 1:
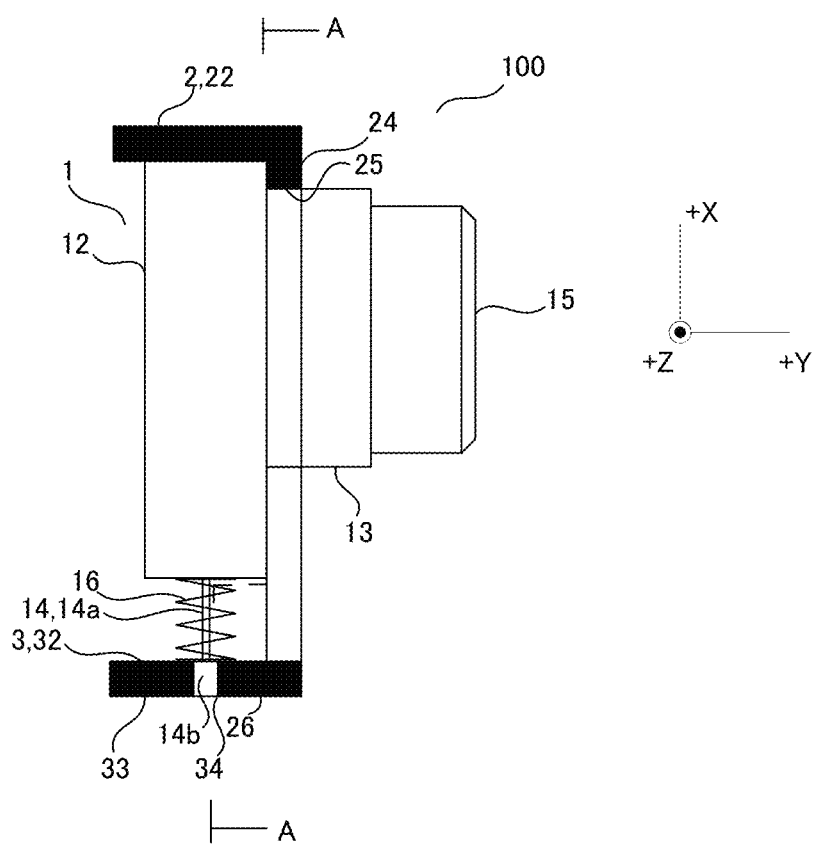
FIG. 1 schematically illustrates a part of an electronic apparatus in an embodiment of the present invention.
Figure 2:
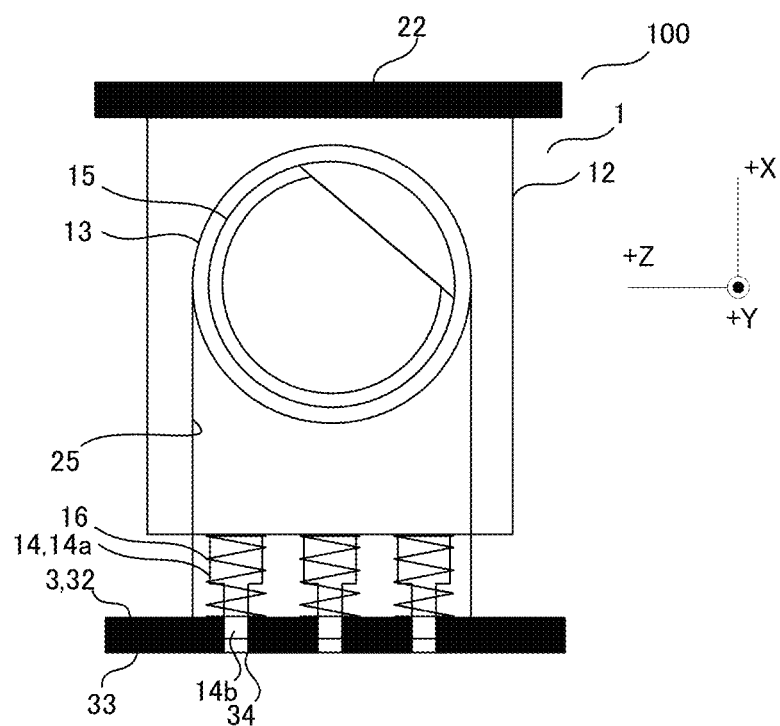
FIG. 2 is a sectional view taken along line A-A of FIG.1.

Hereinafter, an embodiment of the present invention will be described with reference to the accompanying drawings. FIG. 1 schematically illustrates a part of an electronic apparatus in an embodiment of the present invention. FIG. 2 is a sectional view taken along line A-A of FIG. 1. FIG. 1 depicts the X, Y, and Z axes. In FIG. 1, the up-down direction is referred to as the X direction or the long-length direction, the up direction is referred to as the "+X direction", and the down direction is referred to as the "−X direction". Further, in FIG. 1, the left-right direction is referred to as the Y direction, the right direction is referred to as the "+Y direction", and the left direction is referred to as the "−Y direction". Further, in FIG. 1, the inward direction orthogonal to the paper surface is referred to as the Z direction or the short-length direction, the frontward direction is referred to as the "+Z direction", and the rearward direction is referred to as the "−Z direction".

FIGS. 1 and 2 partially illustrate electronic apparatus 100. Electronic apparatus 100 includes electronic component 1, case 2, and printed board 3. Note that, electronic component 1 in the present embodiment is a potentiometer that outputs a voltage proportional to an amount of mechanical displacement of a rotation of an input shaft, or is a rotary encoder that converts an amount of mechanical displacement of a rotation of an input shaft into a digital amount.

Electronic component 1 includes electronic component body 12, terminal 14, and coil spring 16. Note that, FIGS. 1 and 2 omit illustration of the interior of electronic component body 12.

Electronic component body 12 includes bearing part 13 (corresponding to a part to be engaged (hereinafter, referred to as "engaged part") in the present invention) that extends in the +Y direction. Input shaft 15 is rotatably supported by bearing part 13.

As illustrated in FIG. 2, three terminals 14 are arranged so as to be side by side in the Z direction. Terminals 14 extend in the −X direction from electronic component body 12.

Figure 3:
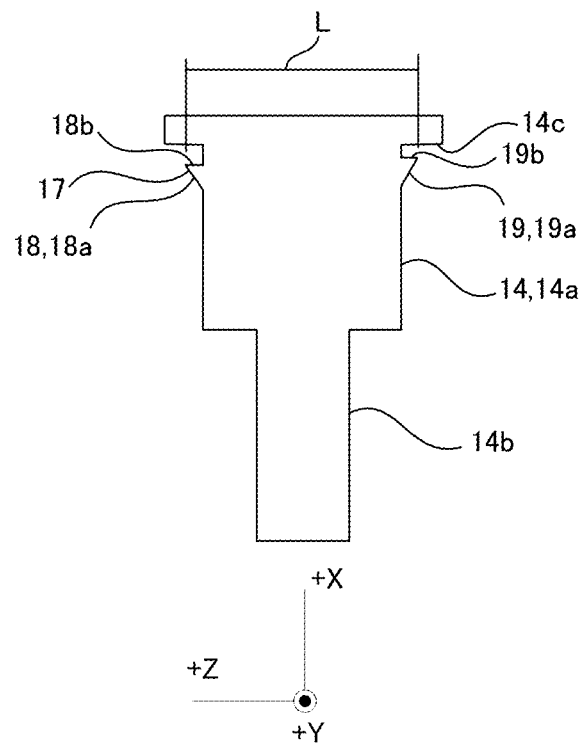
FIG. 3 is a partially enlarged view of a terminal.

FIG. 3 is a partially enlarged view of terminal 14. As illustrated in FIGS. 1 to 3, terminal 14 is, for example, a flat terminal having a long-length direction in the X direction, a plate thickness direction in the Y direction, and a short-length direction in the Z direction. Terminal 14 includes base end part 14a (+X-direction end part) and leading end part 14b (−X-direction end part). Base end part 14a has a wider width than leading end part 14b in the short-length direction (the Z direction). Base end part 14a includes retaining part 17. Retaining part 17 is highlighted in FIG. 3. Further, as illustrated in FIG. 3, base end part 14a includes +X-direction end 14c whose width in the Z direction is the widest in base end part 14a.

Retaining part 17 includes protrusion 18 that protrudes in the +Z direction from a +Z-direction-side edge of base end part 14a. Further, retaining part 17 includes protrusion 19 that protrudes in the −Z direction from a −Z-direction-side edge of base end part 14a. FIG. 3 indicates distance L between protrusions 18 and 19.

−X-Side edge 18a of protrusion 18 is inclined in the +X direction with respect to the +Z direction. +X-Side edge 18b of protrusion 18 extends in the +Z direction from the +Z-direction-side edge of base end part 14a. −X-Side edge 19a of protrusion 19 is inclined in the +X direction with respect to the −Z direction. +X-Side edge 19b of protrusion 19 extends in the −Z direction from the −Z-direction-side edge of base end part 14a.

Figure 4:
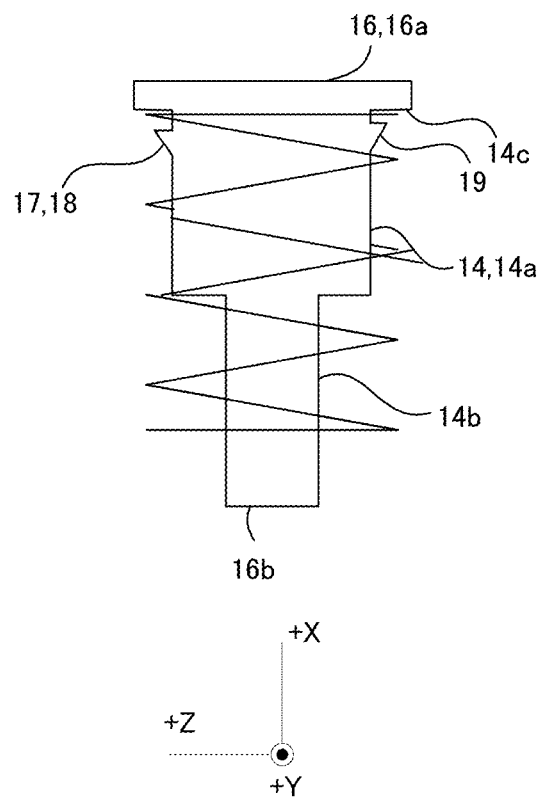
FIG. 4 illustrates a coil spring that is externally fitted around the terminal.

FIG. 4 illustrates coil spring 16 that is externally fitted around terminal 14. Coil spring 16 is electrically conductive. Specifically, coil spring 16 is molded using an electrically conductive material (spring wire). Here, examples of the electrically conductive material include stainless steel, piano wire, phosphor bronze, and alloys thereof. The inner diameter of coil spring 16 is larger than the width of base end part 14a of terminal 14 in the short-length direction (the Z direction) and is smaller than distance L between protrusions 18 and 19 (see FIG. 3). Coil spring 16 is externally fitted around terminal 14 so as to be in electrical contact with terminal 14. Coil spring 16 is retained by retaining part 17. Specifically, +X-direction end part 16a of coil spring 16 is locked to protrusions 18 and 19. +X-Direction end part 16a is a fixing end of coil spring 16.

As illustrated in FIG. 4, the free length of coil spring 16 is longer than the length of coil spring 16 in a case where coil spring 16 is compressed (see FIG. 2). −X-Direction end part 16b of coil spring 16 extends to the position of leading end part 14b of terminal 14 in a case where coil spring 16 is retained by retaining part 17. −X-Direction end part 16b is a free end of coil spring 16.

FIGS. 1 and 2 partially illustrate electronic apparatus 100. As illustrated in FIGS. 1 and 2, case 2 includes bottom wall part 22 and peripheral wall part 24. Case 2 includes opening 26 that opens in the down direction (the −X direction).

Bottom wall part 22 includes a prescribed area on a plane orthogonal to the up-down direction (the X direction). Peripheral wall part 24 extends in the down direction (the −X direction) from the periphery of bottom wall part 22. A −X-direction-end edge of peripheral wall part 24 is the periphery of opening 26. Peripheral wall part 24 includes engagement groove 25. Engagement groove 25 is a groove having a depth direction in the X direction. A groove opening of engagement groove 25 opens in the down direction (the −X direction). The groove width of engagement groove 25 corresponds to the outer diameter of bearing part 13.

Printed board 3 is disposed to face case 2 in the up-down direction (the X direction). Printed board 3 is attached to peripheral wall part 24 of case 2 with a plurality of screws (not illustrated). Printed board 3 is provided with prepared holes (not illustrated) of the screws. The prepared holes are disposed at position corresponding to the respective positions of a plurality of screw grooves (not illustrated) provided in peripheral wall part 24 of case 2. Printed board 3 is attached so as to close opening 26, with upper surface 32 of printed board 3 being directed in the +X direction (the up direction).

As illustrated in FIGS. 1 and 2, printed board 3 includes fitting hole 34. Fitting hole 34 is disposed at a position corresponding to terminal 14. Fitting hole 34 is a round hole having a depth direction in the X direction. Fitting hole 34 is, for example, a through-hole that penetrates printed board 3 from upper surface 32 to lower surface 33.

On upper surface 32 of printed board 3, a conductor (not illustrated) is wired in a peripheral edge part of fitting hole 34. The inner diameter of fitting hole 34 is larger than the width of leading end part 14b of terminal 14 in the short-length direction (the Z direction). Note that, as illustrated in FIG. 1, the inner diameter of fitting hole 34 is larger than the plate thickness of leading end part 14b of terminal 14.

Next, a case where coil spring 16 is externally fitted around terminal 14 of electronic component 1 will be described with reference to FIGS. 3 and 4.

+X-Direction end part 16a of coil spring 16 is externally fitted around leading end part 14b of terminal 14. Further, +X-direction end part 16a is moved in the +X-direction until +X-direction end part 16a exceeds −X-side edge 18a (inclined edge) of protrusion 18 and −X-side edge 19a (inclined edge) of protrusion 19. When +X-direction end part 16a moves along the inclined edges, the inner diameter of +X-direction end part 16a expands against the restoring force. When +X-direction end part 16a exceeds the inclined edges, the inner diameter of +X-direction end part 16a shrinks by the restoring force. Since the inner diameter of +X-direction end part 16a is as a result smaller than distance L between protrusions 18 and 19, +X-direction end part 16a is locked to +X-side edge 18b of protrusion 18 and +X-side edge 19b of protrusion 19. Thus, coil spring 16 is retained by protrusions 18 and 19.

Next, a case where electronic component 1, case 2, and printed board 3 are assembled will be described with reference to FIGS. 1 and 2.

Electronic component 1 is housed in case 2. Specifically, bearing part 13 of electronic component 1 engages with engagement groove 25 of case 2. Thus, electronic component 1 is positioned with respect to case 2. Since coil spring 16 is retained by protrusions 18 and 19, coil spring 16 does not fall even when terminal 14 of electronic component 1 is directed in the down direction (the −X direction), for example. Thus, coil spring 16 is held in a state of being externally fitted around terminal 14. When coil spring 16 is in the state of being externally fitted around terminal 14, +X-direction end part 16a of coil spring 16 is in electrical contact with +X-direction end 14c. Note that, coil spring 16 in the state of being externally fitted around terminal 14 may be in electrical contact with any portion of terminal 14.

Next, printed board 3 is assembled to case 2. Specifically, the position of fitting hole 34 of printed board 3 and the position of leading end part 14b of terminal 14 are aligned with each other in the X direction. Case 2 and printed board 3 are brought closer to each other in the X direction such that leading end part 14b of terminal 14 is fitted in fitting hole 34. Leading end part 14b of terminal 14 is fitted loosely in fitting hole 34. Thus, the position of printed board 3 can be adjusted in the Y direction and the Z direction with respect to case 2 in a state in which leading end part 14b of terminal 14 is fitted in fitting hole 34. Even in a case where there is a slight misalignment between leading end part 14b of terminal 14 and fitting hole 34, it is possible to align the prepared holes on a side of printed board 3 with the screw grooves on a side of case 2 by adjusting the position of printed board 3 with respect to case 2 so that printed board 3 can be screwed to peripheral wall part 24 of case 2.

In a case where printed board 3 is assembled to case 2, −X-direction end part 16b (free end) of coil spring 16 comes into electrical contact with the peripheral edge part of fitting hole 34. Coil spring 16 comes into contact with the peripheral edge part of fitting hole 34 so that coil spring 16 is bent against the restoring force. Thus, coil spring 16 is disposed in a compressed state between printed board 3 and electronic component body 12. Note that, the spring load of coil spring 16 is set such that coil spring 16 and printed board 3 are stably connected.

In the embodiment described above, electronic component 1 includes: electronic component body 12; terminal 14 that extends in the X direction from electronic component body 12 and includes retaining part 17; and coil spring 16 that is externally fitted around terminal 14 so as to be in electrical contact with terminal 14 and is retained by retaining part 17. Coil spring 16 is, in a compressed state, in electrical contact with printed board 3.

According to the above configuration, coil spring 16 is externally fitted around terminal 14 so as to be in electrical contact with terminal 14 and further coil spring 16 is in electrical contact with printed board 3 so that neither soldering work nor welding work for connecting terminal 14 to printed board 3 is required. Thus, it is possible to reduce assembly costs. Further, since coil spring 16 is retained by the retaining part and is held in a state of being externally fitted around terminal 14, it is possible to handle electronic component body 12 and coil spring 16 integrally, which also makes it possible to reduce assembly costs.

Further, since there is no need to provide a solder land in printed board 3, it is possible to increase the freedom of wiring. Further, a connection part is formed by coil spring 16 coming into contact with printed board 3. Accordingly, in a case where an impact or the like is applied to the electronic component, the impact can be absorbed by bending of coil spring 16 against the restoring force or by relative movements of coil spring 16 and printed board 3 against the frictional resistance force so that it is possible to lighten a load to the connection part.

Further, in the embodiment described above, electronic apparatus 100 includes case 2 that houses electronic component 1, and printed board 3 includes fitting hole 34 having a depth direction in the X direction, and is attached to case 2 such that terminal 14 is fitted in fitting hole 34. In a case where printed board 3 is attached to case 2, terminal 14 is fitted in fitting hole 34 so that fitting hole 34 serves as a hole for positioning printed board 3, which makes it possible to easily assemble printed board 3.

Further, coil spring 16 is externally fitted around terminal 14 so that movement of coil spring 16 on the YZ plane is limited. Accordingly, it is possible to prevent coil springs 16 adjacent to each other in the Z direction from coming into contact with each other.

Further, in the embodiment described above, terminal 14 is fitted loosely in fitting hole 34. Thus, the position of printed board 3 can be adjusted in the Y direction and the Z direction with respect to case 2 in a state in which leading end part 14b of terminal 14 is fitted in fitting hole 34 so that alignment between case 2 and printed board 3 can be easily performed, which makes it possible to reduce assembly costs.

In addition, any of the embodiment described above is only illustration of an exemplary embodiment for implementing the present invention, and the technical scope of the present invention shall not be construed limitedly thereby. That is, the present invention can be implemented in various forms without departing from the gist thereof or the main features thereof.

<Variation 1>

Variation 1 of the present embodiment will be described with reference to FIG. 5. In the description of Variation 1, configurations different from those in the embodiment described above will be mainly described, and the same configurations as those in the embodiment described above will be denoted with the same reference signs and descriptions thereof will be omitted.

In the embodiment described above, fitting hole 34 is a through-hole that penetrates printed board 3 from upper surface 32 to lower surface 33 (see FIG. 2).

Figure 5:
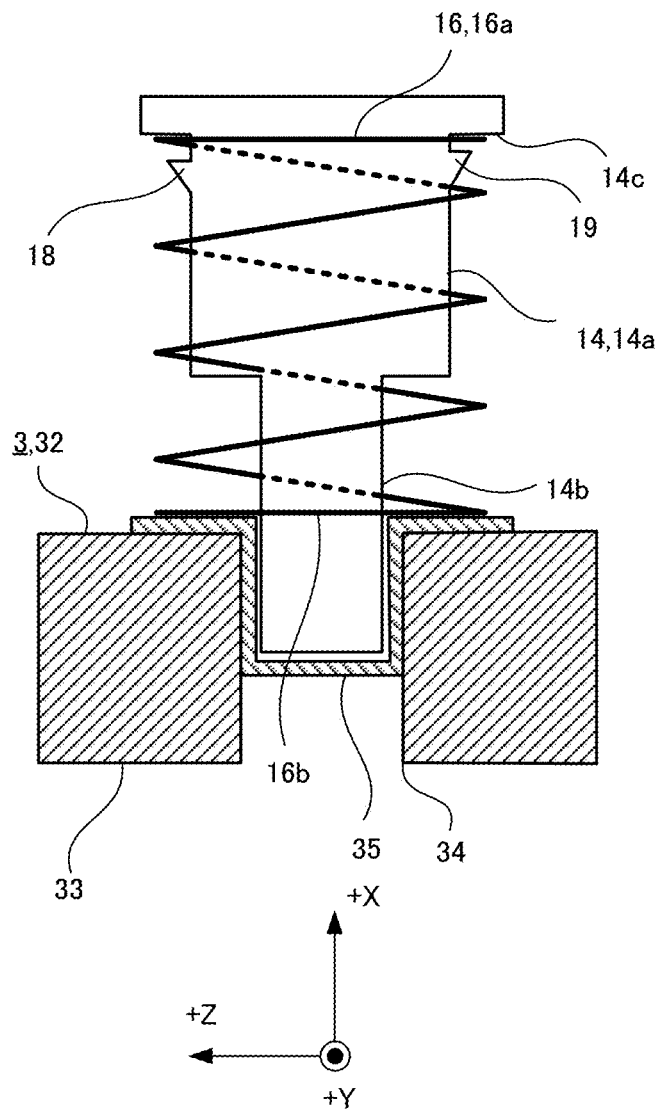
FIG. 5 illustrates a coil spring, in a compressed state, in contact with a printed board in Variation 1.

In Variation 1, on the other hand, fitting hole 34 is a through-hole blocked by grommet 35 as illustrated in FIG. 5. In a case where printed board 3 is assembled to case 2, −X-direction end part 16b (free end) of coil spring 16 comes into electrical contact with grommet 35. Coil spring 16 comes into contact with grommet 35 so that coil spring 16 is bent against the restoring force. Thus, coil spring 16 is disposed in a compressed state between printed board 3 and electronic component body 12 (see FIG. 2).

Note that, although retaining part 17 is protrusions 18 and 19 (see FIG. 4) in the embodiment described above, the present invention is not limited thereto, and retaining part 17 may be a recess, for example. Specifically, the recess is recessed in the −Z direction from the +Z-direction-side edge of base end part 14a of terminal 14, and is also recessed in the +Z direction from the −Z-direction-side edge of base end part 14a. In a case where retaining part 17 is a recess, the inner diameter of +X-direction end part 16a of coil spring 16 is caused to be smaller than the width of base end part 14a in the short-length direction (the Z direction). In a case where coil spring 16 is fitted in base end part 14a, the inner diameter of +X-direction end part 16a of coil spring 16 is widened against the restoring force, and when +X-direction end part 16a of coil spring 16 is moved to the position of the recess, +X-direction end part 16a is locked to the recess by the restoring force.

Further, in the embodiment described above, coil spring 16 is molded using an electrically conductive material, but the present invention is not limited thereto, and coil spring 16 may include an electrically conductive coating film, for example. The coating film is provided by, for example, performing plating processing on the material of coil spring 16. Note that, the material and electrically conductive coating film of coil spring 16 are satisfactory as long as they stably electrically connect coil spring 16 and printed board 3.

<Variation 2>

Figure 6:
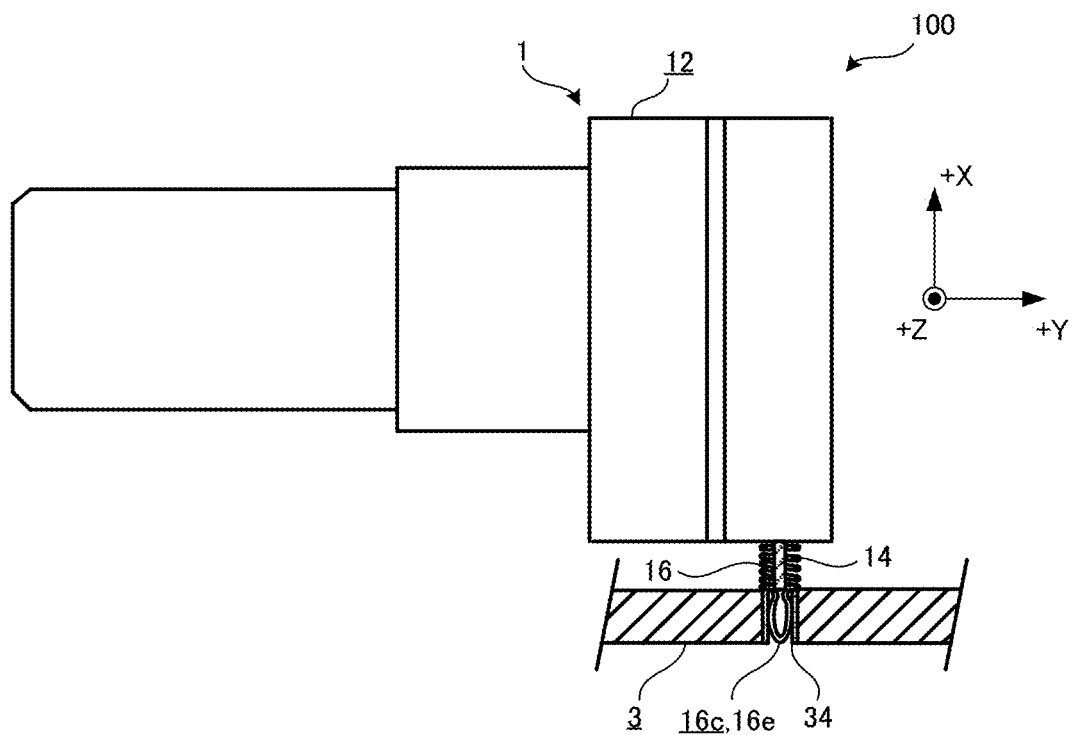
FIG. 6 schematically illustrates a part of an electronic apparatus in Variation 2.
Figure 7:
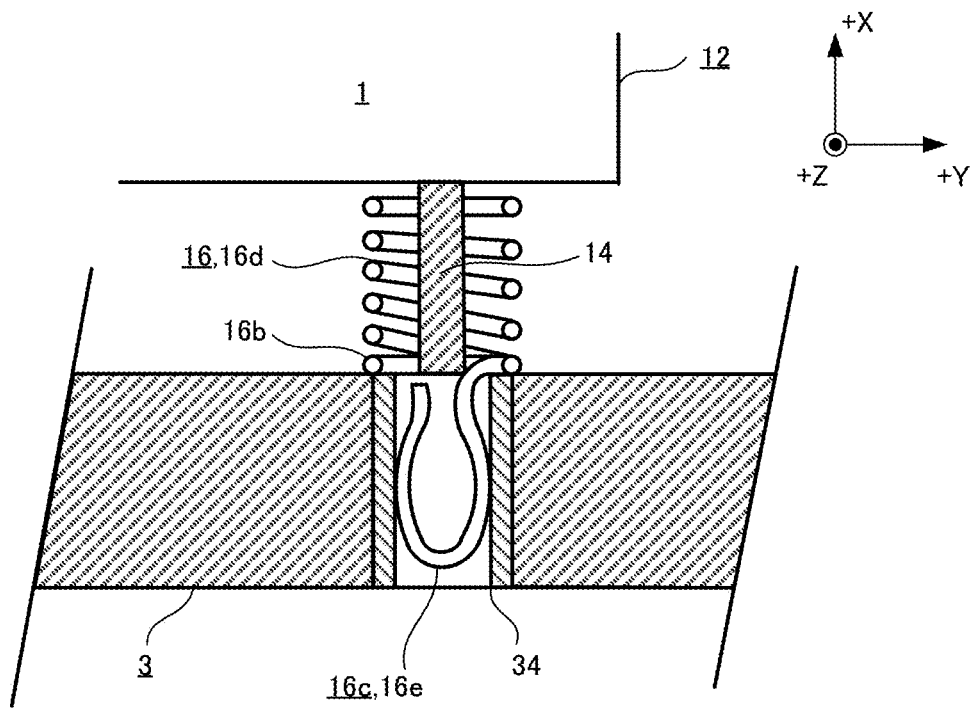
FIG. 7 is a partially enlarged view of FIG. 6.

Variation 2 of the present embodiment will be described with reference to FIGS. 6 and 7. FIG. 6 schematically illustrates a part of an electronic apparatus in Variation 2. FIG. 7 is a partially enlarged sectional view of FIG. 6. In the description of Variation 2, configurations different from those in the embodiment described above will be mainly described, and the same configurations as those in the embodiment described above will be denoted with the same reference signs and descriptions thereof will be omitted.

In the embodiment described above, printed board 3 is attached to case 2 (see FIG. 1) such that terminal 14 is fitted in fitting hole 34.

In Variation 2, on the other hand, −X-direction end part 16b of coil spring 16 includes extension part 16c that extends in the −X direction as illustrated in FIGS. 6 and 7. In other words, coil spring 16 includes extension part 16c, and coil part 16d which is upward from extension part 16c and is externally fitted around terminal 14. Printed board 3 is attached to case 2 such that extension part 16c is fitted in fitting hole 34. Fitting hole 34 includes an electrically conductive coating film. That is, extension part 16c is fitted in fitting hole 34, and terminal 14 is not fitted therein.

Extension part 16c includes folded-back part 16e in which spring wire as a material of coil spring 16 is folded back in a U-shape.

In a state in which extension part 16c is fitted in fitting hole 34, the spring wire of folded-back part 16e is disposed so as to face itself in a radial direction of fitting hole 34. As illustrated in FIG. 7, the spring wire of folded-back part 16e abuts on or is in close proximity to a peripheral wall of fitting hole 34.

For example, in a case where electronic component 1 receives an impact force in the +Y direction with respect to printed board 3 due to a drop of electronic apparatus 100, vibrations applied to electronic apparatus 100, or the like, coil spring 16 and terminal 14 move in the +Y direction since coil part 16d is externally fitted around terminal 14. On the other hand, since the spring wire of folded-back part 16e abuts on or is in close proximity to the peripheral wall of fitting hole 34, folded-back part 16e does not move in the +Y direction and receives a reaction force in the −Y direction from the peripheral wall of fitting hole 34. Thus, coil spring 16 is deformed from coil part 16d to folded-back part 16e, and mitigates the impact by the deformation.

In electronic apparatus 100 in Variation 2, printed board 3 includes fitting hole 34 having a depth direction in the X direction, and is attached to case 2 such that folded-back part 16e of coil spring 16 is fitted in fitting hole 34. Thus, in a case where electronic component 1 receives an impact force in the +Y direction with respect to printed board 3, coil spring 16 has a cushioning function to mitigate the impact by deformation. Further, since folded-back part 16e is maintained in a state of being fitted in fitting hole 34 even in a case where coil spring 16 is deformed, movement of coil part 16d in the +Y direction is limited. Further, since terminal 14 is not fitted in fitting hole 34, terminal 14 does not abut on the peripheral wall of fitting hole 34 at the time of an impact. Thus, it is possible to prevent terminal 14 from being damaged.

<Variation 3>

Figure 8:
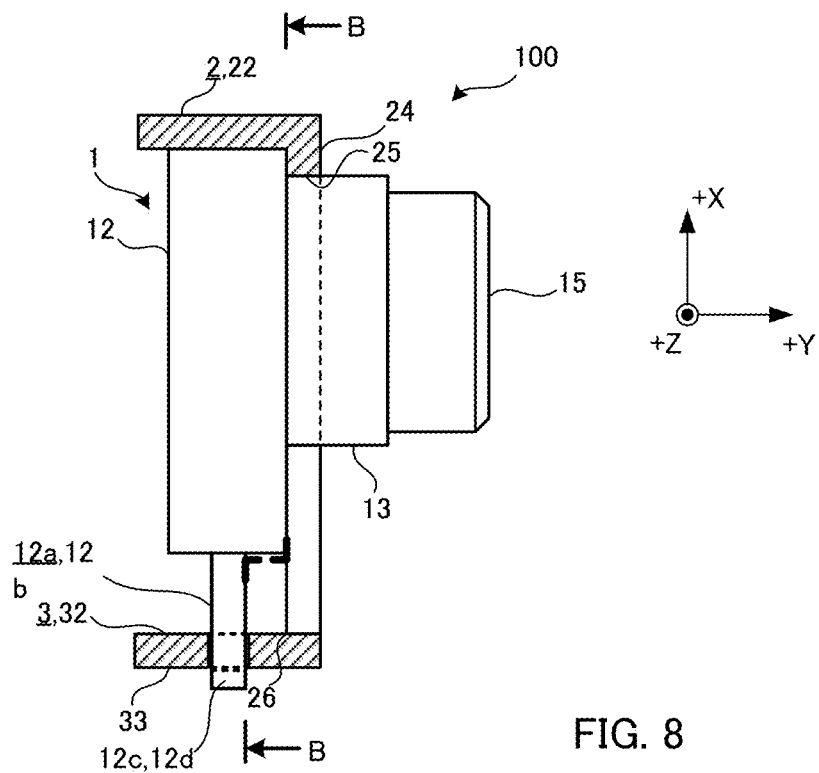
FIG. 8 schematically illustrates a part of an electronic apparatus in Variation 3.
Figure 9:
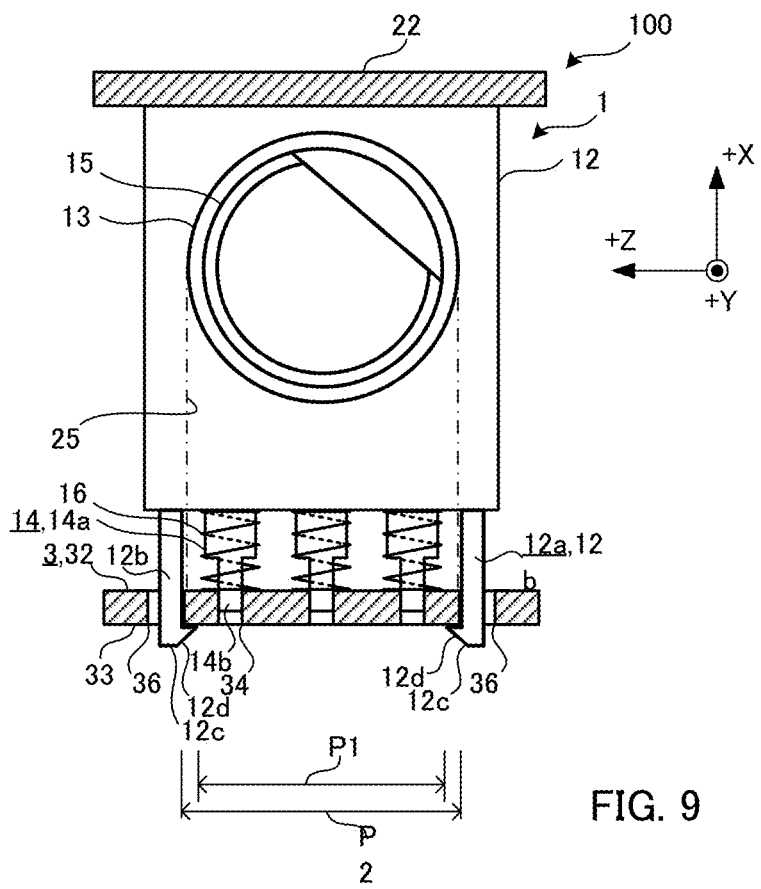
FIG. 9 is a sectional view taken along line B-B of FIG. 8.

Variation 3 of the present embodiment will be described with reference to FIGS. 8 and 9. FIG. 8 schematically illustrates a part of an electronic apparatus in Variation 3. FIG. 9 is a sectional view taken along line B-B of FIG. 8. In the description of Variation 3, configurations different from those in the embodiment described above will be mainly described, and the same configurations as those in the embodiment described above will be denoted with the same reference signs and descriptions thereof will be omitted.

In the assembly procedure of electronic apparatus 100 in the embodiment described above, electronic component 1 and case 2 are first assembled. Then case 2 and printed board 3 are assembled.

In the assembly procedure of electronic apparatus 100 in Variation 3, on the other hand, electronic component 1 and printed board 3 are first assembled (sub-assembly). Then the sub-assembly product is assembled to case 2.

Hereinafter, a configuration that allows the assembly procedure of electronic apparatus 100 in Variation 3 will be described.

As illustrated in FIG. 9, electronic component body 12 includes two hook parts 12a. Hook parts 12a are disposed in left and right end parts of a lower surface (−X direction-end surface) of electronic component body 12. Hook parts 12a are disposed on both sides of three terminals 14 in the left-right direction (the Z direction).

Hook part 12a includes shaft part 12b that extends in the −X direction from the lower surface of electronic component body 12, and projection 12c disposed at an end of shaft part 12b in the −X direction. Projection 12c of hook part 12a on the left side (the +Z direction) includes inclined surface 12d inclined in the left direction (the +Z direction) with respect to the −X direction. Projection 12c of hook part 12a on the right side (the −Z direction) includes inclined surface 12d inclined in the right direction (the −Z direction) with respect to the −X direction. Pitch P1 between projections 12c on the left and right is set to be shorter than pitch P2 between locked holes 36 (to be described later) on the left and right.

As illustrated in FIG. 9, printed board 3 includes two locked holes 36 (part to be locked (hereinafter, referred to as "locked part")) on the left and right. Locked hole 36 has a size that allows projection 12c to pass therethrough.

In a case where electronic component 1 and printed board 3 are assembled, projection 12c on the left side is caused to correspond to locked hole 36 on the left side, and projection 12c on the right side is caused to correspond to locked hole 36 on the right side. Then, electronic component 1 is relatively moved in the down direction (the −X direction) with respect to printed board 3 against the restoring force of coil spring 16. Thus, inclined surface 12d of projection 12c on the left side abuts on an upper-side hole edge of locked hole 36 on the left side, and inclined surface 12d of projection 12c on the right side abuts on an upper-side hole edge of locked hole 36 on the right side so that shaft part 12b of hook part 12a on the left side is bent in the left direction against the restoring force, and shaft part 12b of hook part 12a on the right side is bent in the right direction against the restoring force. Thus, pitch P1 between projections 12c on the left and right spreads to become equal to pitch P2 between locked holes 36 on the left and right. As a result, projection 12c on the left side passes through locked hole 36 on the left side, and projection 12c on the right side passes through locked hole 36 on the right side.

In a case where projections 12c on the left and right pass through locked holes 36 on the left and right, shaft parts 12b of hook parts 12a on the left and right are restored, and pitch P1 between projections 12c on the left and right becomes shorter than pitch P2 between locked holes 36 on the left and right again. Thus, projection 12c on the left side is locked to a lower-side hole edge of locked hole 36 on the left side, and projection 12c on the right side is locked to a lower-side hole edge of locked hole 36 on the right side. Thus, movement of electronic component 1 in the up direction (the +X direction) with respect to printed board 3 is limited. Further, movement of electronic component 1 in the down direction (the −X direction) with respect to printed board 3 is limited by the restoring force of coil spring 16. As a result, electronic component 1 and printed board 3 are assembled (sub-assembly).

In electronic apparatus 100 in Variation 3, printed board 3 includes locked hole 36, electronic component body 12 includes hook part 12a that is locked to locked hole 36 such that electronic component body 12 is attached to printed board 3, and printed board 3 and electronic component body 12 attached to printed board 3 are attached to case 2. Thus, it is possible to attach electronic component 1 to printed board 3 and then to assemble both to case 2.

This application is based on Japanese patent application No. 2019-177100, filed on Sep. 27, 2019, and Japanese patent application No. 2020-000861, filed on Jan. 7, 2020, the contents of which are incorporated herein by reference.

INDUSTRIAL APPLICABILITY

The present invention is suitably utilized in an electronic apparatus including an electronic component which is required to reduce assembly costs and to lighten a load to a connection part.

REFERENCE SIGNS LIST

1 Electronic component
2 Case
3 Printed board
12 Electronic component body
12a Hook part
12b Shaft part
12c Projection
12d Inclined surface
13 Bearing part
14 Terminal
14a Base end part
14b Leading end part
14c +X-Direction end
15 Input shaft
16 Coil spring
16a +X-Direction end part
16b −X-Direction end part
16c Extension part
16d Coil part
16e Folded-back part
17 Retaining part
18, 19 Protrusion
18a, 19a −X-Side edge
18b, 19b +X-Side edge
22 Bottom wall part
24 Peripheral wall part
25 Engagement groove
26 Opening
32 Upper surface
33 Lower surface
34 Fitting hole
35 Grommet
36 Locked hole
100 Electronic apparatus

The invention claimed is:

1. An electronic apparatus, comprising:
an electronic component; and
a case that houses the electronic component, wherein
the electronic component, comprising:
    an electronic component body;
    a terminal that extends in a predetermined direction from the electronic component body and includes a retaining part; and
    a coil spring that is externally fitted around the terminal so as to be in electrical contact with the terminal and is retained by the retaining part,
wherein
the coil spring is, in a compressed state, in electrical contact with a printed board, and
the printed board includes a fitting hole having a depth direction in the predetermined direction, and is attached to the case such that an end part of the coil spring in the predetermined direction is fitted in the fitting hole.

2. The electronic apparatus according to claim 1, wherein the end part of the coil spring in the predetermined direction includes a folded-back part in which spring wire is folded back in a U-shape, the spring wire being a material of the coil spring.

3. The electronic apparatus according to claim 2, wherein the spring wire of the folded-back part is disposed so as to face itself in a radial direction of the fitting hole.

* * * * *